US009664767B2

(12) United States Patent
Cappellaro et al.

(10) Patent No.: US 9,664,767 B2
(45) Date of Patent: May 30, 2017

(54) TIME-RESOLVED MAGNETIC SENSING WITH ELECTRONIC SPINS IN DIAMOND

(71) Applicant: Massachusetts Institute of Technology, Cambridge, MA (US)

(72) Inventors: Paola Cappellaro, Somerville, MA (US); Alexandre Cooper-Roy, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 614 days.

(21) Appl. No.: 14/155,786

(22) Filed: Jan. 15, 2014

(65) Prior Publication Data
US 2014/0340085 A1 Nov. 20, 2014

Related U.S. Application Data

(60) Provisional application No. 61/824,600, filed on May 17, 2013.

(51) Int. Cl.
*G01V 3/00* (2006.01)
*G01R 33/60* (2006.01)
*G01R 33/12* (2006.01)

(52) U.S. Cl.
CPC ......... *G01R 33/60* (2013.01); *G01R 33/1284* (2013.01)

(58) Field of Classification Search
CPC .... G01R 33/60; G01R 33/441; G01R 33/345; G01N 24/10; G01N 24/08
USPC .......................................................... 324/316
See application file for complete search history.

(56) References Cited

U.S. PATENT DOCUMENTS

| 6,310,869 | B1 * | 10/2001 | Holtzman | ............... | H04B 1/707 |
| | | | | | 370/335 |
| 6,735,167 | B1 * | 5/2004 | Nawa | .................... | G06F 17/145 |
| | | | | | 370/208 |
| 2003/0164490 | A1 * | 9/2003 | Blais | .................... | G06N 99/002 |
| | | | | | 257/14 |
| 2010/0308813 | A1 * | 12/2010 | Lukin | .................. | G01R 33/032 |
| | | | | | 324/244.1 |
| 2010/0315079 | A1 | 12/2010 | Lukin et al. | | |
| 2012/0019242 | A1 * | 1/2012 | Hollenberg | ............ | B82Y 35/00 |
| | | | | | 324/300 |

OTHER PUBLICATIONS

International Preliminary Report on Patentability mailed on Nov. 26, 2015, in connection with PCT Application No. PCT/US2014/031329.

(Continued)

*Primary Examiner* — Walter L Lindsay, Jr.
*Assistant Examiner* — Frederick Wenderoth
(74) *Attorney, Agent, or Firm* — Gesmer Updegrove LLP

(57) ABSTRACT

A system for performing Walsh reconstruction of time dependent fields with a quantum probe that includes a diamond structure that includes nitrogen-vacancy (NV) centers for sensing magnetic and electric fields. An arbitrary waveform generator and microwave waveguides manipulate the quantum spins in the diamond structure using a plurality of coherent control sequences to measure the arbitrary profile of time-varying magnetic fields. A laser that optically addresses the quantum spins in the diamond structure for initialization and readout.

13 Claims, 6 Drawing Sheets

(56) References Cited

OTHER PUBLICATIONS

Lu et al., "Hierarchy of measurement-induced Fisher information for composite states" Aug. 1, 2012, arXiv:1208.0104v1 [quant-ph], pp. 1-6.

Maze et al., "Nanoscale magnetic sensing using spin qubits in diamond" Proc. SPIE , vol. 7225, Advanced Optical Concepts in Quantum Computing, Memory, and Communication II, 722509, Feb. 2, 2009, pp. 722509-1-772509-8.

Cappellaro et al., "Environment Assisted Metrology with Spin Quibit" Phys. Rev. A 85, 032336, 2012, arXiv:1201.2684v1 [quant-ph] Jan. 12, 2012, pp. 1-9.

Aiello et al., "Composite-pulse magnetometry with a solid-state quantum sensor" arXiv:1207.5868v1 [quant-ph] Jul. 25, 2012, pp. 1-18.

Magesan et al., "Reconstructing the Profile of Time-Varying Magnetic Fields With Quantum Sensors" arXiv:1305.6604v1 [quant-ph] May 28, 2013, pp. 1-19.

Hirose et al., "Continuous dynamical decoupling magnetometry" arXiv:1207.5729v1 [quant-ph] Jul. 24 2012, pp. 1-5.

Pham et al. "Magnetic field imaging with nitrogen-vacancy ensembles" New Journal of Physics, 13, 2011, Published Apr. 28, 2011, pp. 1-13.

Maze et al., "Nanoscale magnetic sensing with an individual electronic spin in diamond" Nature, vol. 455, Oct. 2, 2008, pp. 644-648.

Pham et al., "Enhanced solid-state multi-spin metrology using dynamical decoupling" Phys. Rev. B 86, 045214 (2012), pp. 1-5.

Taylor et al.. "High-sensitivity diamond magnetometer with nanoscale resolution" Nature Physics 4, 2008, pp. 1-29.

Pham et al., "Magnetic field imaging with nitrogen-vacancy ensembles" New Journal of Physics 13, 2011, pp. 1-13.

Magesan et al., "Reconstructing the profile of time-varying magnetic fields with quantum sensors" Physical Review A 88, 032107, 2013, pp. 032107-1-032107-16.

Cooper et al., "Time-resolved magnetic sensing with electronic spins in diamond" Nature Communications, Jan. 2014, pp. 1-7.

The International Search Report and the Written Opinion issued in connection with corresponding PCT Application No. PCT/US 2014/031329, mailed on Dec. 2, 2014.

* cited by examiner

TIME-RESOLVED MAGNETIC SENSING WITH ELECTRONIC SPINS IN DIAMOND

PRIORITY INFORMATION

This application claims priority from provisional application Ser. No. 61/824,600 filed May 17, 2013, which is incorporated herein by reference in its entirety.

SPONSORSHIP INFORMATION

This invention was made with government support under Contract No. HR0011-11-C-0073 awarded by the Defense Advanced Research Projects Agency. The government has certain rights in the invention.

BACKGROUND OF THE INVENTION

The invention is related to the field of quantum sensors and quantum dynamic parameter estimation, and in particular to time-resolved magnetic sensing with electronic spins in diamond.

Precision measurement is among the most important applications of quantum physics. For example, quantum control of atomic systems forms the physical basis of the world's best clocks. The purpose of quantum metrology is to detect a small external field, coupled to the sensor by a Hamiltonian: $H_b{}^S = b(t)\kappa S_z$, where $S_z$ is the spin operator of the quantum sensor. Here, $b(t)$ can be an external magnetic field or the detuning of a laser from a clock transition while $\kappa$ is the spin's coupling to the field.

The working principle of almost any quantum metrology scheme can be reduced to a Ramsey experiment, where the field is measured via the induced phase difference between two states of the quantum sensor. The quantum probe is prepared in a superposition of two eigenstates of the operator $S_z$, e.g.

$$\left|\psi(0) = \frac{1}{2}(|0\rangle + |1\rangle)\right\rangle$$

and is then let evolve freely under the action of the external field. The eigenstates acquire a phase that is proportional to their eigenvalues (here 0 and 1) and to the parameter to be estimated:

$$\left|\psi(\tau) = \frac{1}{2}(|0\rangle + e^{i\varphi(\tau)}|1\rangle)\right\rangle,$$

with $\varphi(\tau) = \kappa \int_0^T b(t)dt$. This phase difference can be converted in a population difference and measured out. The figure of merit for quantum sensitivity is the smallest field $\delta b_{min}$ that can be read out during a total time T. For a single spin ½, if the sensing time is limited to $\tau$ (e.g. by environmental decoherence) then:

$$\delta b_{min} \approx \frac{1}{\kappa\sqrt{T\tau}}.$$

SUMMARY OF THE INVENTION

According to one aspect of the invention, there is provided a system for performing Walsh reconstruction of time dependent fields with a quantum probe. The system includes a diamond structure that includes nitrogen-vacancy (NV) centers for sensing magnetic and electric fields. An arbitrary waveform generator and microwave waveguides manipulate the quantum spins in the diamond structure using a plurality of coherent control sequences to measure the arbitrary profile of time-varying magnetic fields. A laser that optically addresses the quantum spins in the diamond structure for initialization and readout.

According to another aspect of the invention, there is provided a method of performing Walsh reconstruction. The method includes positioning a diamond structure that includes nitrogen-vacancy (NV) centers for sensing magnetic and electric fields. Also, the method providing a plurality of coherent control sequences to measure the arbitrary profile of time-varying magnetic fields arbitrary using waveform generator and microwave waveguides that manipulate the quantum spins in the diamond structure. The method includes optically addressing the quantum spins in the diamond structure for initialization and readout using a laser.

DETAILED DESCRIPTION OF THE INVENTION

The invention introduces a novel approach to accurately reconstruct the arbitrary profile of time-varying fields using coherent control sequences associated with the Walsh functions. These sequences act as digital filters that efficiently extract information about the field dynamics while suppressing decoherence. One has experimentally demonstrated the inventive approach by performing proof-of-principle reconstruction of the magnetic field radiated by a physical model of a neuron using a single electronic spin in diamond. The method is useful for performing time-resolved magnetic sensing with quantum probes in a broad array of physical and biological systems at the nanometer scale.

Quantum probes enable the sensitive detection of time-varying fields with nanometer spatial resolution. In particular, nitrogen-vacancy (NV) centers in diamond have recently emerged as promising sensors of magnetic and electric fields. Although coherent control techniques have measured the amplitude of constant or oscillating fields, these techniques are unable to measure fields with unknown dynamics. Quantum estimation techniques can be applied to measure time-varying fields by monitoring the shift in the resonance energy of a qubit sensor, e.g., via Ramsey interferometry measurements. The qubit sensor, first prepared in an equal superposition of its eigenstates, accumulates a phase $$\phi(T) = \gamma \int_0^T b(t)\,dt,$$

where $\gamma$ is the strength of the interaction with the time-varying field b(t) during the acquisition period T.

Figure 1:
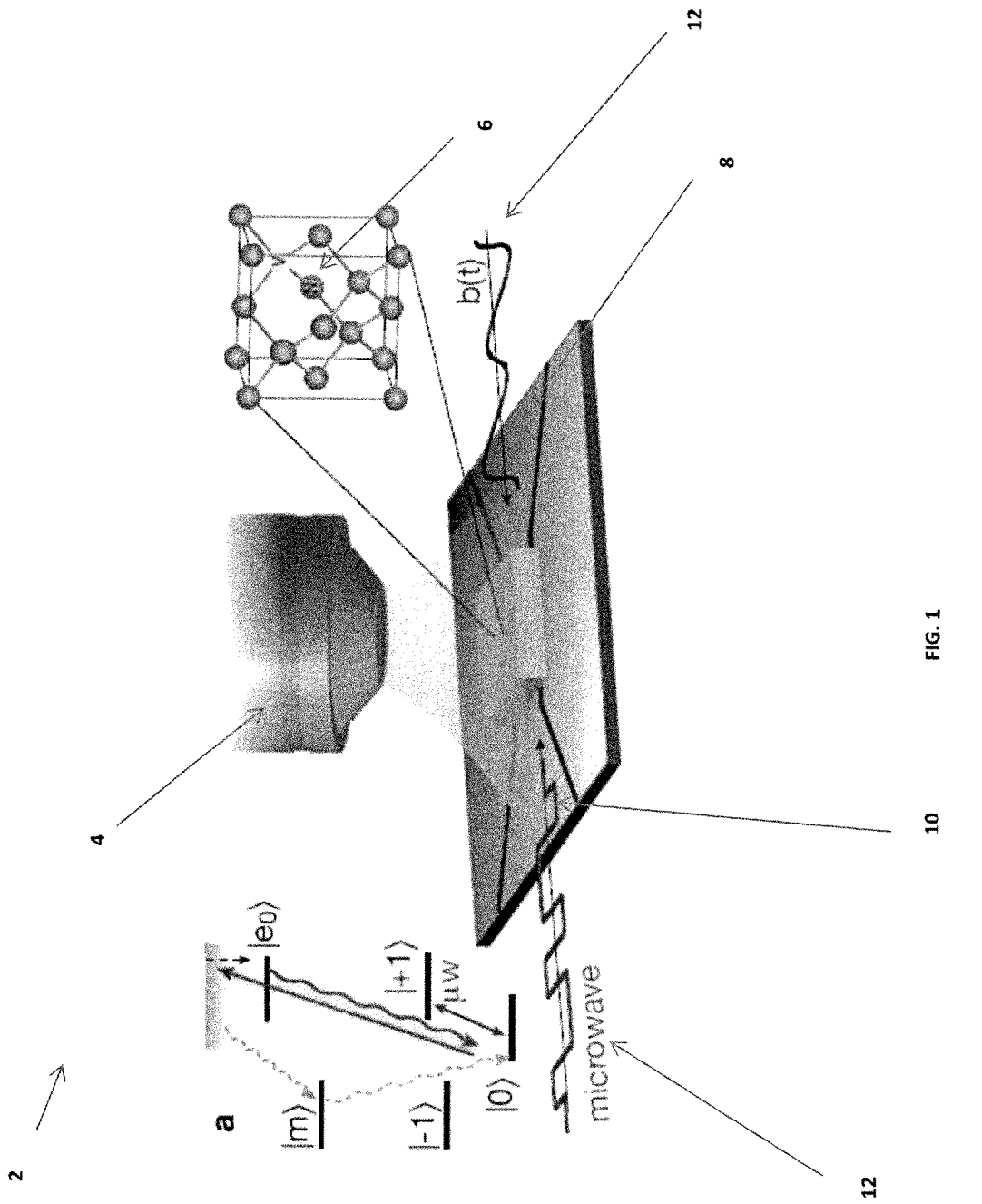
FIG. 1 is a schematic diagram illustrating the Walsh reconstruction technique for measuring time-varying field with quantum probes.

The field dynamics could be mapped by measuring its amplitude over N successive acquisition periods of duration $\delta t = T/N$; however, this sequential sensing method is often impractical due to short coherence times and it is inefficient. Instead, the invention proposes to reconstruct the temporal profile of time-varying fields by using a set of digital filters, implemented with coherent control sequences over the whole acquisition period T, which simultaneously extract information about the field dynamics and protect the qubit sensor from noise. The method can achieve the field dynamics reconstruction N-times faster than the sequential sensing method (or with a $\sqrt{N}$ smaller error for the same fixed time). Specifically, one can use control protocols, as shown in FIG. 1, associated with the Walsh functions, which form a complete orthonormal basis of digital filters and are easily implementable experimentally. Because a $\pi$-pulse effectively reverses the evolution of the qubit sensor, sequences of $\pi$-pulses act as digital filters that sequentially switch the sign of the evolution between $\pm 1$.

In particular, FIG. 1 shows the Walsh reconstruction technique 2 for measuring time-varying field with quantum probes in accordance with an exemplary embodiment of the invention. A single NV center in diamond 6, optically initialized and read out by confocal microscopy 4, is manipulated with coherent control sequences 6 to measure the arbitrary profile of time-varying magnetic fields 12 radiated by a coplanar waveguide 8 under ambient conditions.

If $w_m(t/T)$ is the digital filter created by applying m control $\pi$-pulses at the zero-crossings of the m-th Walsh function, the normalized phase acquired by the qubit sensor is $$\frac{1}{\gamma T}\phi_m(T) = \frac{1}{T}\int_0^T b(t)w_m(t/T)\,dt \equiv \hat{b}(m) \qquad \text{Eq. 1}$$

where $\hat{b}(m)$ is the m-th Walsh coefficient, defined as the Walsh transform of b(t) evaluated at sequence number (sequency) m. Successive measurements with the first N Walsh sequences $\{w_m(t/T)\}_{m=0}^{N-1}$ give a set of N Walsh coefficients $\{\hat{b}(m)\}_{m=0}^{N-1}$ that can be used to reconstruct an N-point functional approximation to the field $$b_N(t) = \Sigma \hat{b}(m) w_m(t/T) \qquad \text{Eq. 2}$$

Eq. (2) is the inverse Walsh transform of order N, which gives the best least-squares Walsh approximation to b(t). With few assumptions or prior knowledge about the field dynamics, the reconstruction can be shown to be accurate with quantifiable truncation errors and convergence criteria.

The Walsh reconstruction method was experimentally demonstrated by measuring increasingly complex time-varying magnetic fields with a single NV center in an isotopically purified diamond sample. NV centers in diamond have recently emerged as promising sensors for magnetic and electric fields, rotations and temperature. These sensors are ideal for nanoscale imaging of living biological systems due to their low cytotoxicity, surface functionalizations, optical trapping capability and long coherence time under ambient conditions. A single NV center is optically initialized and read out by confocal microscopy under ambient conditions. A coplanar waveguide 10 delivers both resonant microwave pulses and off-resonant magnetic fields produced by an arbitrary waveform generator.

Figure 2A:
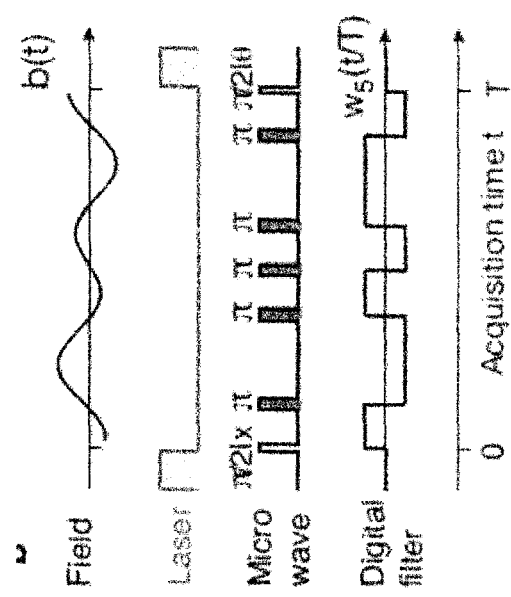
FIGS. 2A-2B are graphs illustrating the coherent control sequences and the N-point functional approximation of the field is obtained by sampling the field.
Figure 2B:
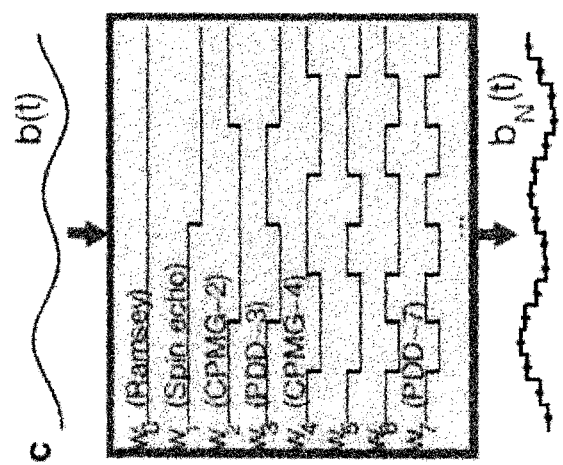

FIG. 2A shows the coherent control sequences, acting as digital filters on the evolution of the qubit sensor to extract information about time-varying fields. FIG. 2B shows an N-point functional approximation of the field is obtained by sampling the field with a set of N digital filters taken from the Walsh basis, which contain some known set of decoupling sequences such as the even-parity CPMG sequences ($w^{2n}$) and the odd-parity PDD sequences ($w^{2n-1}$).

Figures 3A, 3B, 3C:
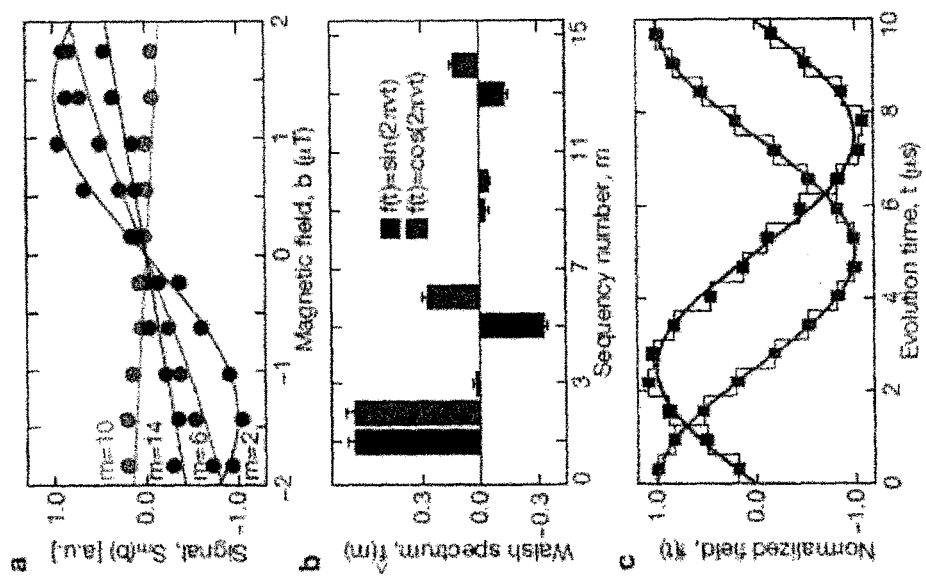
FIGS. 3A-3C are graphs illustrating the invention approach to Walsh reconstruction.

First, the monochromatic sinusoidal fields, $b(t) = b \sin(2\pi\nu t + \alpha)$, are reconstructed by measuring the Walsh spectrum up to fourth order ($N = 2^4$). The m-th Walsh coefficient $\hat{f}(m)$ of the normalized field $f(t) = b(t)/b$ was obtained by sweeping the amplitude of the field and measuring the slope of the signal $S_m(b) = \sin(\gamma b \hat{f}(m) T)$ the origin (FIG. 3A). FIG. 3B shows the measured non-zero Walsh coefficients of the Walsh spectrum. As shown in FIG. 3C, the 16-point reconstructed fields are in good agreement with the expected fields. The Walsh reconstruction method is thus phase selective as it discriminates between fields with the same frequency but different phases.

Figures 4A, 4B:
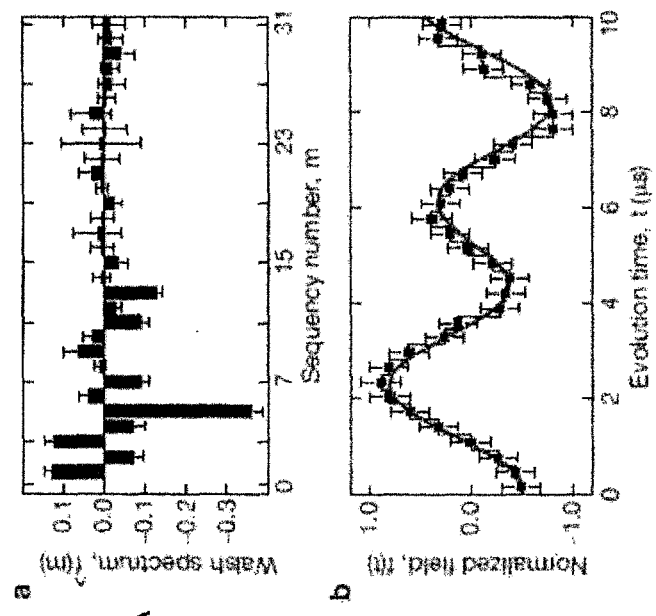
FIGS. 4A-4B are graphs illustrating a 32-point reconstruction of a bichromatic magnetic field.

One can further reconstruct a bichromatic field $b(t) = b[a_1 \sin(2\pi\nu_1 t + \alpha_1) + a_2 \sin(2\pi\nu_2 t + \alpha_2)]$. FIG. 4A shows the measured Walsh spectrum up to fifth order ($N = 2^5$). As shown in FIG. 4B, the 32-point reconstructed field agrees with the expected field, which demonstrates the accuracy of the Walsh reconstruction method. In contrast, sampling the field with an incomplete set of digital filters, such as the CPMG and PDD sequences, extracts only partial information about the field dynamics. By linearity of the Walsh transform, the Walsh reconstruction method applies to any polychromatic field (and by extension to any time-varying field), whose frequency spectrum lies in the acquisition bandwidth [1/T, 1/$\tau$] set by the coherence time $T < T_2$ and the maximum sampling time $\tau = T/N$, which is in turn limited by the finite duration of the control $\pi$-pulses.

The performance of the Walsh reconstruction method is determined by the reconstruction error $e_N$ and the measurement sensitivity $\eta_N$. The least-squares reconstruction error $e_N = //b_N(t) - b(t)//_2$ due to truncation of the Walsh spectrum up to $N = 2^n$ coefficients is bounded by $e_N \leq \max_{t \in [0,T]} |\partial_t b(t)|/2^{n+1}$ and vanishes to zero as N tends to infinity (as needed for perfect reconstruction). This implies that although the resources grow exponentially with n, the error converges exponentially quickly to zero, and only a finite number of coefficients is needed to accurately reconstruct the field.

The measurement sensitivity of the m-th Walsh sequence in M measurements, $\eta_m = \delta bm \sqrt{MT}$, gives the minimum field amplitude, $\delta bm = \Delta S_m / \partial S_m / \partial b_m | \sqrt{M}$, that can be measured with fixed resources:

$$\eta_m = \frac{v_m^{-1}}{\gamma_e C \sqrt{T} \sqrt{n_{NV}} |\hat{f}(m)|} = \frac{\hat{\eta}_m}{|\hat{f}(m)|} \qquad \text{Eq. 3}$$

where $\gamma_e = 2\pi \cdot 28$ Hz/nT is the gyromagnetic ratio of the NV electronic spin, $n_{NV}$ is the density of NV centers in the sensing volume, and C accounts for inefficient photon collection and finite contrast due to spinstate mixing during optical measurements [1, 23]. Here $vm = (e^{-T/T_2(m)})^{p(m)} \leq 1$ is the visibility decay, where $T_2(m)$ and $p(m)$ characterize the decoherence of the qubit sensors during the m-th Walsh sequence in the presence of a specific noise environment.

The sensitivity $\eta_m$ is thus the ratio between a field independent factor $\hat{\eta}_m$ and a field-dependent Walsh coefficient $|\hat{f}(m)|$. One can estimate $\hat{\eta}_m \sim 100\,\text{pT}\sqrt{\mu m^3}/\sqrt{\text{Hz}}$ based on physical parameters and previous experiments with ensemble of NV centers. Note if the field dynamics is known, so that the Walsh coefficients can be precomputed, the best estimate of the field amplitude is obtained by choosing the Walsh sequence that gives the optimal measurement sensitivity. Because the Walsh sequences suppress dephasing noise and can extend coherence times by many order of magnitudes, the choice of the most sensitive Walsh sequence involves a trade-off between large Walsh coefficients and long coherence times.

The amplitude resolution of the Walsh reconstruction method, $\delta b_N = \sqrt{\Sigma_m \delta \hat{b}_m^2}$, gives the smallest variation of the reconstructed field that can be measured from the Walsh spectrum of order N. If each Walsh coefficient is obtained from M measurements over the acquisition period T, the measurement sensitivity of the Walsh reconstruction method, $\eta_N = \delta b_N \sqrt{MNT}$, is $$\eta_N = \sqrt{N \sum_m \hat{\eta}_m^2} = \frac{\sqrt{N \sum_m^N v_m^2}}{\gamma_e C \sqrt{T} \sqrt{n_{NV}}} \qquad \text{EQ. 4}$$

The measurement sensitivity $\eta_N$ combines with the reconstruction error $e_N$ to determine the accuracy of the Walsh reconstruction method. If some small coefficients cannot be resolved due to low signal visibility, the increase in reconstruction error can be analytically quantified using data compression results. In the same way, the acquisition time can be reduced by sampling only the most significant coefficients and discarding other negligible coefficients. Furthermore, if the field is sparse in some known basis, which is often the case, a logarithmic scaling in resources can be achieved by using compressed sensing methods based on convex optimization algorithms.

The Walsh reconstruction method is readily applicable to measuring time-varying fields in a variety of physical systems. Promising applications include magnetic resonance spectroscopy of spins extrinsic to the diamond lattice, measurements of the dynamics of magnetic nanostructures or magnetic vortices in nanodisk chains. Whereas spectroscopic methods based on periodic dynamical decoupling have been used to reconstruct the noise spectral density in a variety of solid-state quantum systems, the Walsh reconstruction method could be used to simplify the problem of spectral reconstruction of stochastic fields by removing the need for functional approximations or non-linear deconvolution algorithms.

A paradigmatic application for quantum sensors is measuring magnetic fields radiated by single neurons, triggered on-demand by external excitation. The flow of ions in the neuronal axon radiates a magnetic field on the order of hundreds of pT that could be measured with state-of-the-art diamond magnetometers over ms acquisition periods. As a proof-of-principle implementation, the magnetic field radiated is measured by a physical model of a neuron undergoing an action potential $\Phi(t)$ approximated by a skew normal impulse. Due to its linear response in the kHz regime], the coplanar waveguide acts as the physical model of a neuron, with the radiated magnetic field given by the derivative of the electric field: $b(t) = d\Phi(t)/dt$.

Figures 5A, 5B:
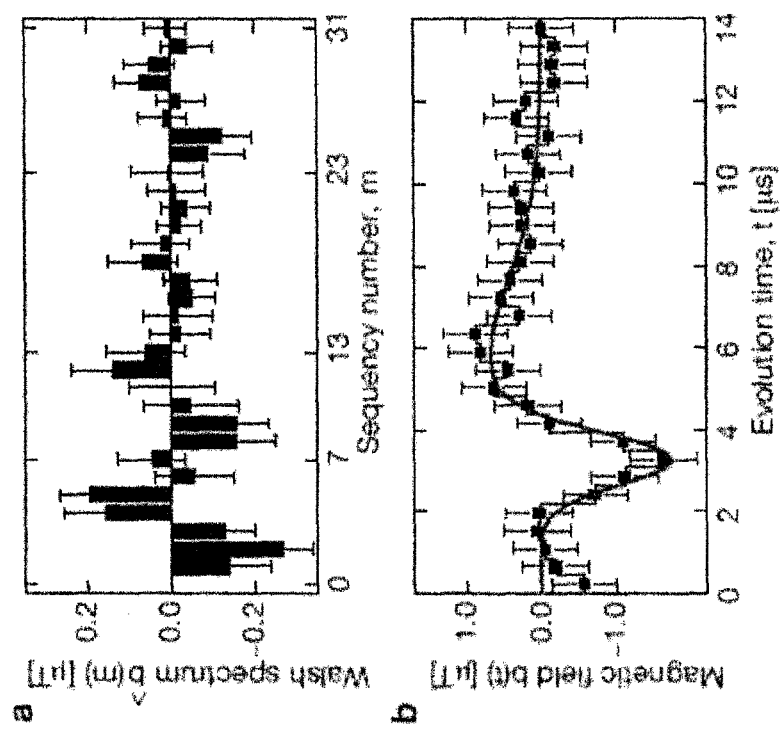
FIGS. 5A-5B are graphs illustrating a 64-point reconstruction of a magnetic field radiated by a skew normal impulse flowing through the physical model of a neuron.

The Walsh coefficients were measured by fixing the amplitude of the field and sweeping the phase of the last read-out pulse to reconstruct the absolute field b(t) rather than the normalized field f(t). FIG. 5A shows the measured Walsh spectrum up to fifth order (N=25). As shown in FIG. 5B, the 32-point reconstructed field is in good agreement with the expected field. Although the acquisition time and the field amplitude were chosen to satisfy the limitations of the experimental apparatus, extending the reconstruction method to measuring in-vivo neuronal magnetic fields is within reach with improvements in collection efficiency, pulse duration, coherence times, proximity to the field source and by using ensemble of NV centers.

The invention utilizes a novel approach where control sequences acting as digital filters on the evolution of a single NV electronic spin to efficiently sample and accurately reconstruct the arbitrary profile of time-varying fields. The Walsh reconstruction method generalizes current sensing methods and allows for accurate reconstruction of time-varying fields with quantifiable errors and formal convergence criteria. The method achieves faster dynamic parameter reconstruction than naïve, sequential methods or a sensitivity enhancement at fixed time. Possible extensions include exploiting other digital sampling techniques, such as the wavelet transform. The method is compatible with compressed sensing algorithms that achieve a reduction in both resources and reconstruction error. The Walsh reconstruction method is readily implementable with quantum probes in practical applications such as neuronal activity recording with nanodiamonds functionalized to target specific receptor sites on neuronal cells, spatiotemporal field imaging of neuronal.

Although the present invention has been shown and described with respect to several preferred embodiments thereof, various changes, omissions and additions to the form and detail thereof, may be made therein, without departing from the spirit and scope of the invention.

What is claimed is:

1. A system for performing Walsh reconstruction of time dependent fields with a quantum probe comprising:
    a diamond structure that includes nitrogen-vacancy (NV) centers for sensing magnetic and electric fields;
    arbitrary waveform generator and microwave waveguides that manipulate the quantum spins in the diamond structure using a plurality of coherent control sequences to measure the arbitrary profile of time-varying magnetic fields;
    a laser to optically address the quantum spins in the diamond structure for initialization and readout; and
    a plurality of digital filters that are implemented using the coherent control sequences over a specified acquisition period, the digital filters simultaneously extracting information about dynamics of the time-varying magnetic fields and minimizing the effects of noise.

2. The system of claim 1, wherein the coherent control sequences suppress decoherence.

3. The system of claim 1, wherein the coherent control sequences are implemented over the whole acquisition period defined by the specified length of the time-varying field to be measured.

4. The system of claim 1, wherein the arbitrary waveform generator and microwave waveguides produce π-pulses that effectively reverse the evolution between ±1.

5. The system of claim 1, wherein the π-pulses of claim 4 create control sequences that act as digital filters to extract information about the time-varying magnetic fields allowing for Walsh reconstruction to be performed.

6. The system of claim 1, wherein the Walsh reconstruction comprises successive measurements of the sensor's state after evolution under the external fields and the control sequences, which can be used to reconstruct an N-point functional approximation to the time-varying magnetic fields by performing an inverse Walsh transform.

7. The system of claim 1, wherein the diamond structure comprises an isotopically purified diamond sample.

8. A method of performing Walsh reconstruction of time dependent fields with a quantum probe comprising:
- positioning a diamond structure that includes nitrogen-vacancy (NV) centers for sensing magnetic and electric fields;
- providing a plurality of coherent control sequences to measure the arbitrary profile of time-varying magnetic fields arbitrary using waveform generator and microwave waveguides that manipulate the quantum spins in the diamond structure;
- optically addressing the quantum spins in the diamond structure for initialization and readout using a laser; and
- implementing a plurality of digital filters using the coherent control sequences over a specified acquisition period, the digital filters simultaneously extracting information about dynamics of the time-varying magnetic fields and minimizing the effects of noise.

9. The method of claim 8, wherein the coherent control sequences suppress decoherence.

10. The method of claim 8, wherein the arbitrary waveform generator and microwave waveguides produce $\pi$-pulses that effectively reverse the evolution between ±1.

11. The method of claim 8, wherein the $\pi$-pulses of claim 4 create control sequences that act as digital filters to extract information about the time-varying magnetic fields allowing for Walsh reconstruction to be performed.

12. The method of claim 8, wherein the Walsh reconstruction comprises successive measurements of the sensor's state after evolution under the external fields and the control sequences, which can be used to reconstruct an N-point functional approximation to the time-varying magnetic fields by performing an inverse Walsh transform.

13. The method of claim 8, wherein the diamond structure comprises an isotopically purified diamond sample.

* * * * *